United States Patent
Scheidt et al.

(10) Patent No.: US 11,547,063 B1
(45) Date of Patent: Jan. 10, 2023

(54) LIGHT-EMITTING DEVICES FOR HORTICULTURE APPLICATIONS

(71) Applicant: CreeLED, Inc., Durham, NC (US)

(72) Inventors: Paul Scheidt, Durham, NC (US); Anna Costine, Morrisville, NC (US); Derek Miller, Columbus, OH (US); Colin Blakely, Raleigh, NC (US)

(73) Assignee: CreeLED, Inc., Durham, NC (US)

( * ) Notice: Subject to any disclaimer, the term of this patent is extended or adjusted under 35 U.S.C. 154(b) by 0 days.

(21) Appl. No.: 17/663,940

(22) Filed: May 18, 2022

(51) Int. Cl.
| | | |
|---|---|---|
| *A01G 9/24* | (2006.01) | |
| *A01G 7/04* | (2006.01) | |
| *F21V 9/30* | (2018.01) | |
| *H01L 25/075* | (2006.01) | |
| *H01L 33/50* | (2010.01) | |
| *H01L 33/56* | (2010.01) | |
| *H01L 33/32* | (2010.01) | |
| *F21Y 115/10* | (2016.01) | |

(52) U.S. Cl.
CPC ............ *A01G 7/045* (2013.01); *F21V 9/30* (2018.02); *H01L 25/0753* (2013.01); *H01L 33/502* (2013.01); *H01L 33/56* (2013.01); *F21Y 2115/10* (2016.08); *H01L 33/32* (2013.01)

(58) Field of Classification Search
CPC ......... A01G 7/045; F21V 9/30; H01L 33/502; H01L 33/56; H01L 33/32; F21Y 2115/10
See application file for complete search history.

(56) References Cited

U.S. PATENT DOCUMENTS

| | | | |
|---|---|---|---|
| 7,893,445 B2 | 2/2011 | van de Ven et al. | |
| 2009/0108269 A1* | 4/2009 | Negley ............... | H01L 27/156 257/E33.061 |

(Continued)

FOREIGN PATENT DOCUMENTS

| | | | | |
|---|---|---|---|---|
| CN | 103672493 A | * | 3/2014 | |
| WO | WO-2009055079 A1 | * | 4/2009 | ............. H01L 24/14 |

OTHER PUBLICATIONS

CN103672493_Light_source_device_for_adjusting_growth_of_plants_machine_translation.pdf (Year: 2014).*

(Continued)

*Primary Examiner* — Tracie Y Green
(74) *Attorney, Agent, or Firm* — Withrow & Terranova, P.L.L.C.

(57) ABSTRACT

Solid-state lighting devices and more particularly light-emitting devices for horticulture applications are disclosed. Light-emitting devices are disclosed with aggregate emissions that target chlorophyll absorption peaks while also providing certain broader spectrum emissions between the chlorophyll absorption peaks. The aggregate emissions may be provided by light-emitting diodes (LEDs) that emit wavelengths that correspond with certain chlorophyll absorption peaks and lumiphoric materials that provide broader spectrum emissions. The aggregate emissions are configured to have reduced emissions from lumiphoric materials in ranges close to certain chlorophyll absorption peaks, such as above 600 nanometers (nm). In this regard, light-emitting devices according to the present disclosure provide the ability to efficiently target specific chlorophyll absorption peaks for plant growth while also providing suitable lighting for occupants in a horticulture environment.

20 Claims, 5 Drawing Sheets

(56) References Cited

U.S. PATENT DOCUMENTS

| | | | |
|---|---|---|---|
| 2010/0259190 A1* | 10/2010 | Aikala | H01L 33/62 |
| | | | 257/E33.061 |
| 2012/0218750 A1* | 8/2012 | Klase | F21V 5/007 |
| | | | 362/231 |
| 2014/0340890 A1* | 11/2014 | Hata | F21V 29/74 |
| | | | 438/27 |
| 2016/0286747 A1* | 10/2016 | Matsumoto | A01G 31/02 |
| 2021/0123573 A1* | 4/2021 | Kim | F21K 9/64 |
| 2021/0134766 A1* | 5/2021 | Suich | H01L 33/26 |
| 2022/0260236 A1* | 8/2022 | Li | F21V 9/38 |

OTHER PUBLICATIONS

Author Unknown, "Technical Requirements for LED-based Horticultural Lighting," Version 2.1, Jun. 30, 2021, DLC, 29 pages.

\* cited by examiner

LIGHT-EMITTING DEVICES FOR HORTICULTURE APPLICATIONS

FIELD OF THE DISCLOSURE

The present disclosure relates to solid-state lighting devices and more particularly to light-emitting devices for horticulture applications.

BACKGROUND

Solid-state lighting devices such as light-emitting diodes (LEDs) are increasingly used in both consumer and commercial applications. Advancements in LED technology have resulted in highly efficient and mechanically robust light sources with a long service life. Accordingly, modern LEDs have enabled a variety of new display applications and are being increasingly utilized for general illumination applications, often replacing incandescent and fluorescent light sources.

LEDs are solid-state devices that convert electrical energy to light and generally include one or more active layers of semiconductor material (or an active region) arranged between oppositely doped n-type and p-type layers. When a bias is applied across the doped layers, holes and electrons are injected into the one or more active layers where they recombine to generate emissions such as visible light or ultraviolet emissions.

LED technology is increasingly being developed for horticulture applications where emissions are provided to stimulate photosynthesis in growing plants. LED manufacturers for horticulture applications must balance multiple application tradeoffs of efficacy, longevity, spectral optimization, and optical distribution.

The art continues to seek improved LEDs and solid-state lighting devices having desirable illumination characteristics capable of overcoming challenges associated with conventional lighting devices.

SUMMARY

Aspects disclosed herein relate to solid-state lighting devices and more particularly to light-emitting devices for horticulture applications. Light-emitting devices are disclosed with aggregate emissions that target primary chlorophyll absorption peaks while also providing certain broader spectrum emissions between the chlorophyll absorption peaks. The aggregate emissions may be provided by light-emitting diodes (LEDs) that emit wavelengths that correspond with certain chlorophyll absorption peaks and lumiphoric materials that provide the broader spectrum emissions. The aggregate emissions are configured to have reduced emissions from lumiphoric materials in ranges close to certain chlorophyll absorption peaks, such as above 600 nanometers (nm), thereby providing enhanced efficiency of photosynthetically active radiation. In this regard, light-emitting devices according to the present disclosure provide the ability to efficiently target specific chlorophyll absorption peaks for plant growth while also providing suitable lighting for occupants in a horticulture environment and providing increased light penetration to lower portions of plant canopies.

In one aspect, a light-emitting device comprises: a first light-emitting diode (LED) chip configured to emit a first peak wavelength in a range from 600 nanometers (nm) to 700 nm; a second LED chip configured to emit a second peak wavelength in a range from 400 nm to less than 480 nm; and a lumiphoric material arranged to convert at least a portion of emissions from the second LED chip to a third peak wavelength in a range from 480 nm to less than 600 nm, wherein the lumiphoric material comprises less than 10% by weight of lumiphoric particles with emissions greater than 600 nm; wherein aggregate emissions for the first LED chip, the second LED chip, and the lumiphoric material comprise: a total photosynthetic photon flux (PPF) of wavelengths in a range from 400 nm to 700 nm, the total PPF comprising a first PPF in a first wavelength band from 400 nm to 499 nm, a second PPF in a second wavelength band from 500 nm to 599 nm, and a third PPF in a third wavelength band from 600 nm to 700 nm; wherein the third PPF is in a range from 30% to 60% of the total PPF; and wherein a ratio of the second PPF to the first PPF is in a range from 1 to 4. In certain embodiments, the first peak wavelength is in a range from 650 nm to 670 nm and the second peak wavelength is in a range from 440 nm to 475 nm. In certain embodiments, the third peak wavelength is in a range from 500 nm to 600 nm. In certain embodiments, the third peak wavelength is in a range from 480 nm to 510 nm. In certain embodiments, the aggregate emissions comprise an efficiency of at least 3.1 PPF per watt (PPF/W) in a wavelength range of 400 nm to 700 nm. In certain embodiments, the efficiency is in a range from 3.1 to 3.5 PPF/W. In certain embodiments, the ratio of the second PPF to the third PPF is in a range from 1.9 to 3.5. In certain embodiments, the aggregate emissions have less than 10% emissions generated by any lumiphoric materials with peak wavelength emissions above 600 nm. In certain embodiments: the first LED chip resides within a first LED package, the first LED package comprising a first support element and a first encapsulant; the second LED chip and lumiphoric material reside within a second LED package, the second LED package comprising a second support element and a second encapsulant; and the first LED package and the second LED package are mounted on a common substrate. In certain embodiments, the first LED chip, the second LED chip, and the lumiphoric material reside within a same LED package, the LED package comprising a support element on which the first LED chip and the second LED chip are mounted and an encapsulant that covers at least a portion of the first LED chip and the second LED chip.

In another aspect, a light-emitting device comprises: a first light-emitting diode (LED) chip configured to emit a first peak wavelength in a range from 600 nanometers (nm) to 700 nm; a second LED chip configured to emit a second peak wavelength in a range from 400 nm to less than 480 nm; and a lumiphoric material arranged to convert at least a portion of emissions from the second LED chip to a third peak wavelength in a range from 480 nm to less than 600 nm, wherein the lumiphoric material comprises less than 10% by weight of lumiphoric particles with emissions greater than 600 nm; wherein aggregate emissions for the first LED chip, the second LED chip, and the lumiphoric material comprise an efficiency of at least 3.1 photosynthetic photon flux (PPF) per watt (PPF/W) in a range from 400 nm to 700 nm. In certain embodiments, a total PPF comprises wavelengths in a range from 400 nm to 700 nm, the total PPF comprising: a first PPF in a first wavelength band from 400 nm to 499 nm; a second PPF in a second wavelength band from 500 nm to 599 nm; and a third PPF in a third wavelength band from 600 nm to 700 nm; wherein the third PPF is in a range from 30% to 60% of the total PPF. In certain embodiments, a ratio of the second PPF to the third PPF is in a range from 1 to 4. In certain embodiments, the third peak wavelength is in a range from 500 nm to 600 nm.

In certain embodiments, the third peak wavelength is in a range from 480 nm to 510 nm. In certain embodiments, the efficiency is in a range from 3.1 to 3.5 PPF/W. In certain embodiments, the aggregate emissions have less than 10% emissions generated by any lumiphoric materials with peak wavelength emissions above 600 nm. In certain embodiments, the aggregate emissions have less than 5% emissions generated by any lumiphoric materials with peak wavelength emissions above 600 nm. In certain embodiments: the first LED chip resides within a first LED package, the first LED package comprising a first support element and a first encapsulant; the second LED chip and lumiphoric material reside within a second LED package, the second LED package comprising a second support element and a second encapsulant; and the first LED package and the second LED package are mounted on a common substrate. In certain embodiments, the first LED chip, the second LED chip, and the lumiphoric material reside within a same LED package, the LED package comprising a support element on which the first LED chip and the second LED chip are mounted and an encapsulant that covers at least a portion of the first LED chip and the second LED chip.

In another aspect, any of the foregoing aspects individually or together, and/or various separate aspects and features as described herein, may be combined for additional advantage. Any of the various features and elements as disclosed herein may be combined with one or more other disclosed features and elements unless indicated to the contrary herein.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments are described herein with reference to schematic illustrations of embodiments of the disclosure. As such, the actual dimensions of the layers and elements can be different, and variations from the shapes of the illustrations as a result, for example, of manufacturing techniques and/or tolerances, are expected. For example, a region illustrated or described as square or rectangular can have rounded or curved features, and regions shown as straight lines may have some irregularity. Thus, the regions illustrated in the figures are schematic and their shapes are not intended to illustrate the precise shape of a region of a device and are not intended to limit the scope of the disclosure. Additionally, sizes of structures or regions may be exaggerated relative to other structures or regions for illustrative purposes and, thus, are provided to illustrate the general structures of the present subject matter and may or may not be drawn to scale. Common elements between figures may be shown herein with common element numbers and may not be subsequently re-described.

Aspects disclosed herein relate to solid-state lighting devices and more particularly to light-emitting devices for horticulture applications. Light-emitting devices are disclosed with aggregate emissions that target primary chlorophyll absorption peaks while also providing certain broader spectrum emissions between the chlorophyll absorption peaks. The aggregate emissions may be provided by light-emitting diodes (LEDs) that emit wavelengths that correspond with certain chlorophyll absorption peaks and lumiphoric materials that provide the broader spectrum emissions. The aggregate emissions are configured to have reduced emissions from lumiphoric materials in ranges close to certain chlorophyll absorption peaks, such as above 600 nanometers (nm), thereby providing enhanced efficiency of photosynthetically active radiation. In this regard, light-emitting devices according to the present disclosure provide the ability to efficiently target specific chlorophyll absorption peaks for plant growth while also providing suitable lighting for occupants in a horticulture environment and providing increased light penetration to lower portions of plant canopies.

Before delving into specific details of various aspects of the present disclosure, an overview of various elements that may be included in exemplary LEDs of the present disclosure is provided for context. An LED chip typically comprises an active LED structure or region that can have many different semiconductor layers arranged in different ways. The fabrication and operation of LEDs and their active structures are generally known in the art and are only briefly discussed herein. The layers of the active LED structure can be fabricated using known processes with a suitable process being fabrication using metal organic chemical vapor deposition. The layers of the active LED structure can comprise many different layers and generally comprise an active layer sandwiched between n-type and p-type oppositely doped epitaxial layers, all of which are formed successively on a growth substrate. It is understood that additional layers and elements can also be included in the active LED structure, including, but not limited to, buffer layers, nucleation layers, super lattice structures, undoped layers, cladding layers, contact layers, and current-spreading layers and light extraction layers and elements. The active layer can comprise a single quantum well, a multiple quantum well, a double heterostructure, or super lattice structures.

The active LED structure can be fabricated from different material systems, with some material systems being Group III nitride-based material systems. Group III nitrides refer to those semiconductor compounds formed between nitrogen (N) and the elements in Group III of the periodic table, usually aluminum (Al), gallium (Ga), and indium (In). Gallium nitride (GaN) is a common binary compound. Group III nitrides also refer to ternary and quaternary compounds such as aluminum gallium nitride (AlGaN), indium gallium nitride (InGaN), and aluminum indium gallium nitride (AlInGaN). For Group III nitrides, silicon (Si) is a common n-type dopant and magnesium (Mg) is a common p-type dopant. Accordingly, the active layer, n-type layer, and p-type layer may include one or more layers of GaN, AlGaN, InGaN, and AlInGaN that are either undoped or doped with Si or Mg for a material system based on Group III nitrides. Other material systems include silicon carbide (SiC), organic semiconductor materials, and other Group III-V systems such as gallium phosphide (GaP), gallium arsenide (GaAs), indium phosphide (InP), and related compounds.

An LED chip can also be covered with one or more lumiphoric materials (also referred to herein as lumiphors), such as phosphors, such that at least some of the light from the LED chip is absorbed by the one or more lumiphors and is converted to one or more different wavelength spectra according to the characteristic emission from the one or more lumiphors. In this regard, at least one lumiphor receiving at least a portion of the light generated by the LED source may re-emit light having different peak wavelength than the LED source. An LED source and one or more lumiphoric materials may be selected such that their combined output results in light with one or more desired characteristics such as color, color point, intensity, spectral density, etc. In certain embodiments, lumiphoric materials having cyan or green peak wavelengths may be used. In certain embodiments, the LED chip and corresponding lumiphoric material may be configured to primarily emit converted light from the lumiphoric material so that aggregate emissions include little to no perceivable emissions that correspond to the LED chip itself.

Lumiphoric materials as described herein may be or include one or more of a phosphor, a scintillator, a lumiphoric ink, a quantum dot material, a day glow tape, and the like. Lumiphoric materials may be provided by any suitable means, for example, direct coating on one or more surfaces of an LED, dispersal in an encapsulant material configured to cover one or more LEDs, and/or coating on one or more optical or support elements (e.g., by powder coating, inkjet printing, or the like). In certain embodiments, lumiphoric materials may be downconverting or upconverting, and combinations of both downconverting and upconverting materials may be provided. In certain embodiments, multiple different (e.g., compositionally different) lumiphoric materials arranged to produce different peak wavelengths may be arranged to receive emissions from one or more LED chips. One or more lumiphoric materials may be provided on one or more portions of an LED chip in various configurations. In certain embodiments, lumiphoric materials may be provided over one or more surfaces of LED chips, while other surfaces of such LED chips may be devoid of lumiphoric material.

In certain embodiments, one or more lumiphoric materials may be provided as at least a portion of a wavelength conversion element or cover structure that is provided over an LED chip. Wavelength conversion elements or cover structures may include a support element and one or more lumiphoric materials that are provided by any suitable means, such as by coating a surface of the support element or by incorporating the lumiphoric materials within the support element. In some embodiments, the support element may be composed of a transparent material, a semi-transparent material, or a light-transmissive material, such as sapphire, SiC, silicone, and/or glass (e.g., borosilicate and/or fused quartz). Wavelength conversion elements and cover structures of the present disclosure may be formed from a bulk material which is optionally patterned and then singulated. In certain embodiments, the patterning may be performed by an etching process (e.g., wet or dry etching), or by another process that otherwise alters a surface, such as with a laser or saw. In certain embodiments, wavelength conversion elements and cover structures may comprise a generally planar upper surface that corresponds to a light emission area of the LED package. Wavelength conversion elements and cover structures may be attached to one or more LED chips using, for example, a layer of transparent adhesive. In various embodiments, wavelength conversion elements may comprise configurations such as phosphor-in-glass or ceramic phosphor plate arrangements. Phosphor-in-glass or ceramic phosphor plate arrangements may be formed by mixing phosphor particles with glass frit or ceramic materials, pressing the mixture into planar shapes, and firing or sintering the mixture to form a hardened structure that can be cut or separated into individual wavelength conversion elements.

As used herein, a layer or region of a light-emitting device may be considered to be "transparent" when at least 80% of emitted radiation that impinges on the layer or region emerges through the layer or region. Moreover, as used herein, a layer or region of an LED is considered to be "reflective" or embody a "mirror" or a "reflector" when at least 80% of the emitted radiation that impinges on the layer or region is reflected. In some embodiments, the emitted radiation comprises visible light such as blue and/or green LEDs with or without lumiphoric materials. In other embodiments, the emitted radiation may comprise nonvisible light. For example, in the context of GaN-based blue and/or green LEDs, silver (Ag) may be considered a reflective material (e.g., at least 80% reflective). In the case of UV LEDs, appropriate materials may be selected to provide a desired, and in some embodiments high, reflectivity and/or a desired, and in some embodiments low, absorption. In certain embodiments, a "light-transmissive" material may be configured to transmit at least 50% of emitted radiation of a desired wavelength.

According to aspects of the present disclosure, LED packages may include one or more elements, such as lumiphoric materials, encapsulants, light-altering materials, lenses, and electrical contacts, among others, that are provided with one or more LED chips. In certain aspects, an LED package may include a support member, such as a submount or a leadframe. Suitable materials for the submount include, but are not limited to, ceramic materials such as aluminum oxide or alumina, AlN, or organic insulators like polyimide (PI) and polyphthalamide (PPA). In other embodiments, a submount may comprise a printed circuit board (PCB), sapphire, Si or any other suitable material. For PCB embodiments, different PCB types can be used such as standard FR-4 PCB, metal core PCB, or any other type of PCB. In still further embodiments, the support structure may embody a lead frame structure. Light-altering materials may be arranged within LED packages to reflect or otherwise redirect light from the one or more LED chips in a desired emission direction or pattern.

As used herein, light-altering materials may include many different materials including light-reflective materials that reflect or redirect light, light-absorbing materials that absorb light, and materials that act as a thixotropic agent. As used herein, the term "light-reflective" refers to materials or particles that reflect, refract, scatter, or otherwise redirect light. For light-reflective materials, the light-altering material may include at least one of fused silica, fumed silica, titanium dioxide ($TiO_2$), or metal particles suspended in a binder, such as silicone or epoxy. For light-absorbing materials, the light-altering material may include at least one of carbon, silicon, or metal particles suspended in a binder, such as silicone or epoxy. The light-reflective materials and the light-absorbing materials may comprise nanoparticles. In certain embodiments, the light-altering material may comprise a generally white color to reflect and redirect light. In other embodiments, the light-altering material may comprise a generally opaque color, such as black or gray for absorbing light and increasing contrast. In certain embodiments, the light-altering material includes both light-reflective material and light-absorbing material suspended in a binder.

Figure 1:
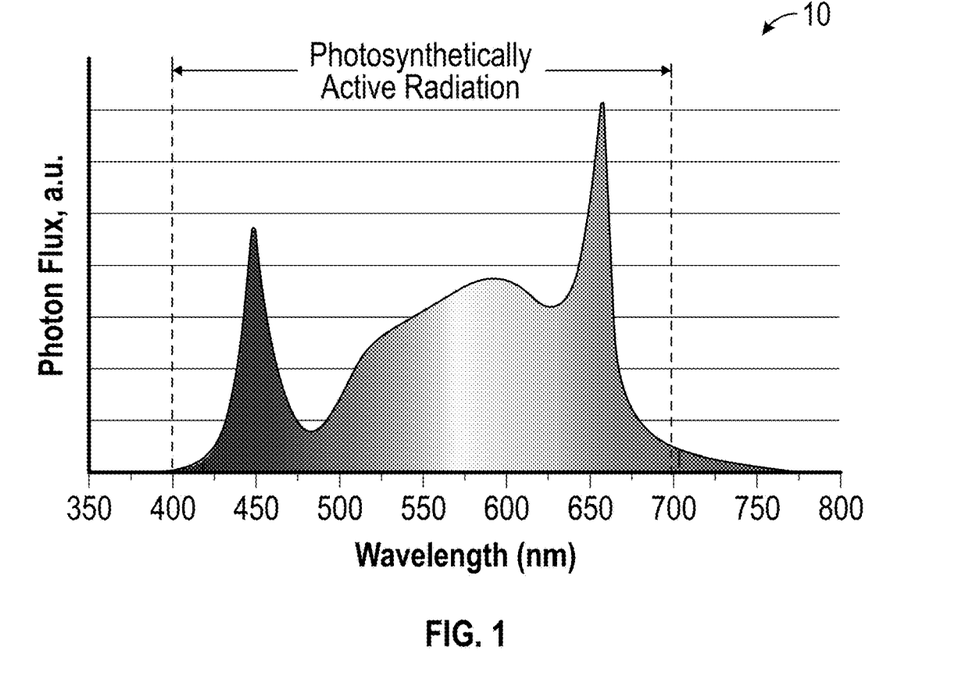
FIG. 1 is spectral plot of a light-emitting diode (LED)-based lighting device that may be used in horticulture applications.

FIG. 1 is spectral plot 10 of an LED-based lighting device that may be used in horticulture applications. The x-axis indicates the wavelength in nanometers (nm) while the y-axis indicates a photon flux in arbitrary units. In practice a common unit for photon flux is micromoles per second (μmol/s). A spectral range for photosynthetically active radiation (PAR) is indicated from a wavelength range of 400 nm to 700 nm. The PAR refers to the portion of the visible light spectrum utilized in the process of photosynthesis. Chlorophylls in plants are the principal photoreceptors responsible for capturing electromagnetic radiation energy for stimulating photosynthesis. Primary chlorophyll absorption peaks exist in certain blue and red ranges, such as a range from 450 nm to 500 nm and in another range from 660 nm to 700 nm. Conventional horticulture lighting devices that just focus on these chlorophyll absorption peaks tend to provide light with an undesirable purple glow. Other horticulture lighting applications may provide full-spectrum lighting as shown in FIG. 1. To provide such full-spectrum emissions, certain conventional lighting devices employ broad-spectrum phosphors that convert portions of the blue emissions to green, yellow, and red portions of the PAR. In FIG. 1, a sharp peak at about 450 nm indicates a blue LED and another sharp peak just above 650 nm indicates a red LED, while broad-spectrum phosphor emissions are indicated from about 500 nm to wavelengths that overlap with those of the red LED. While such broad-spectrum emissions may be more visibly appealing for humans that work in horticulture applications, some efficiency losses may be attributed to wavelength-converted portions of the broadband emissions, particularly those that are at 600 nm or longer wavelengths.

Figure 2:
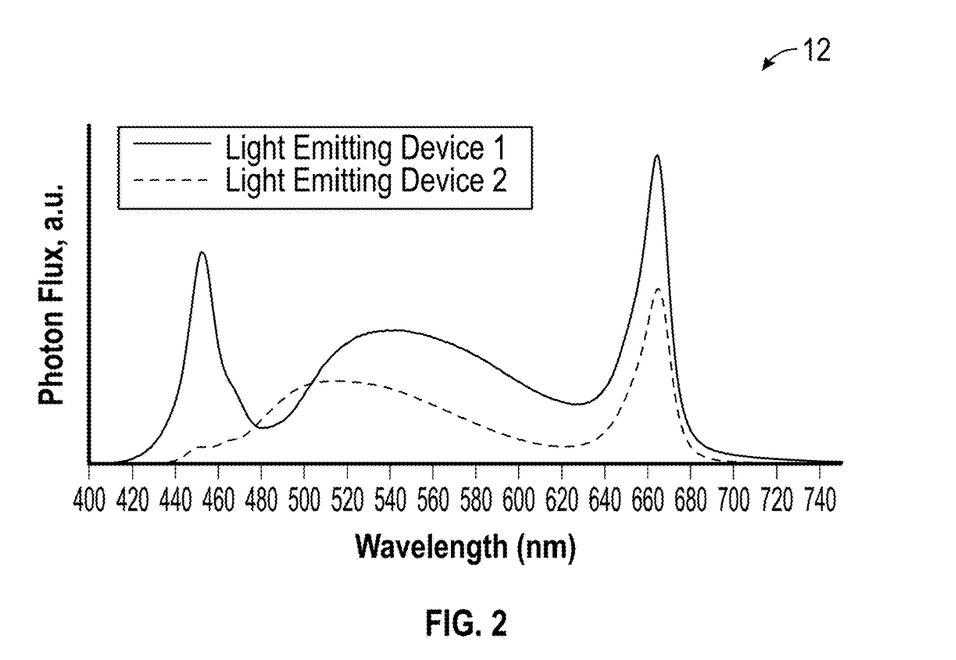
FIG. 2 is a spectral plot for exemplary LED-based lighting devices in delivering photosynthetically active radiation (PAR) in horticulture applications.

FIG. 2 is a spectral plot 12 for exemplary LED-based lighting devices in delivering PAR in horticulture applications according to principles of the present disclosure. In FIG. 2, emissions for an exemplary Light-Emitting Device 1 and an exemplary Light-Emitting Device 2 are shown. The spectral plot for the Light-Emitting Device 1 is provided by aggregate emissions from a red LED with a peak wavelength in a range from 650 nm to 670 nm, for example about 665 nm, a blue LED with a peak wavelength in a range from 400 nm to 480 nm, for example just above 450 nm, and a recipient lumiphoric material that coverts a portion of emissions from the blue LED to broader green wavelengths between about 500 nm and 600 nm. As illustrated, the wavelength-converted emissions taper off greater than 600 nm so that the aggregate emissions have decreased emissions before sharply ramping up near the 665 nm emissions of the red LED. In this regard, primary chlorophyll absorption peaks are provided while also having certain broader spectrum emissions between the blue and red peaks. Notably, the dip in aggregate emissions between 600 nm and the red LED emissions indicates reduced wavelength-conversion emissions in these ranges. Removing such conversions may be associated with increased overall efficiency. In order to achieve such reduction in wavelengths greater than 600 nm, the recipient lumiphoric material may comprises less than 10% by weight of lumiphoric particles with peak emissions greater than 600 nm. In further embodiments, the recipient lumiphoric material may comprises less than 5%, or less than 1%, or less than 0.5%, or even 0% by weight of lumiphoric particles with emissions greater than 600 nm. In still further embodiments, aggregate emissions for the Light-Emitting Device 1 have less than 10%, or less than 5%, or less than 1%, or less than 0.5% emissions generated by lumiphoric materials with peak wavelength emissions greater than 600 nm. By reducing wavelength-converted emissions greater than 600 nm, chlorophyll absorption peaks greater than 600 nm may be efficiently targeted by red LED emissions.

The spectral plot for the Light-Emitting Device 2 is provided by aggregate emissions from a red LED with a peak wavelength in a range from 650 nm to 670 nm, for example at about 665 nm, a blue LED with a peak wavelength in a range from 400 nm to 480 nm, for example just above 450 nm, and a recipient lumiphoric material that coverts a portion of emissions from the blue LED to broader cyan and wavelengths in a range from about 480 nm to 510 nm and extending into green wavelengths up to about 560 nm, before tapering off. As such, the Light-Emitting Device 2 provides the same chlorophyll absorption peak in the red range and a slightly longer chlorophyll absorption peak in the blue range, while also covering certain broader emissions therebetween. In a similar manner as the Light-Emitting Device 1, aggregate emissions for the Light-Emitting Device 2 are configured to have reduced wavelength-converted portions between about 600 nm and the red LED for improved efficiency. In order to achieve such reduction in wavelengths above 600 nm, the recipient lumiphoric material may comprises less than 10% by weight of lumiphoric particles with emissions greater than 600 nm. In further embodiments, the recipient lumiphoric material may comprises less than 5%, or less than 1%, or less than 0.5%, or even 0% by weight of lumiphoric particles with emissions greater than 600 nm. In still further embodiments, aggregate emissions for the Light-Emitting Device 1 have less than 10%, or less than 5%, or less than 1%, or less than 0.5% emissions generated by lumiphoric materials with peak wavelength emissions above 600 nm.

While the exemplary Light-Emitting Device 1 and the Light-Emitting Device 2 are provided in FIG. 2, different combinations of red LEDs, blue LEDs, and recipient lumiphoric materials may be selected that target certain chlorophyll absorption peaks. In this regard, aspects of the present disclosure relate to providing suitable blue and red emissions peaks while also providing reduced wavelength-converted emissions above about 600 nm. It is appreciated that chlorophyll absorption peaks are present above 600 nm and reducing wavelength-converted emissions in this range would appear counterproductive. However, it has been found that such combinations provide the ability to target specific chlorophyll absorption peaks while also providing suitable lighting for occupants in a horticulture environment, all while providing substantially enhanced efficiency due to the reductions in wavelength-converted emissions above about 600 nm. As will be described in greater detail below, aspects of the present disclosure provide enhanced ability to target specific wavelength bands of PAR with increased photosynthetic photon flux (PPF) and enhanced efficiency as indicated in PPF per watt (PPF/W). As used herein, commonly used units for PPF are μmol/s.

Figure 3:
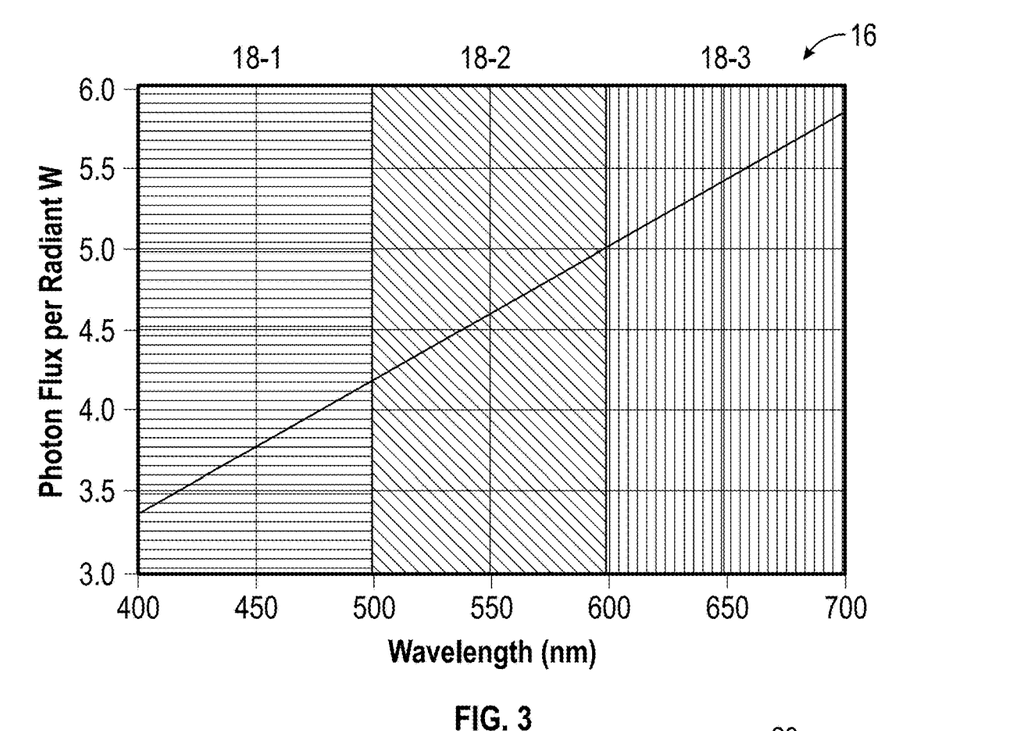
FIG. 3 is plot indicating photosynthetic photon flux per watt (PPF/W) across various individual wavelength bands of the PAR according to principles of the present disclosure.

Aggregate spectral emissions in lighting devices for horticulture applications may generally be quantified with PPF and PPF/W values for the entire PAR. In certain applications, it is useful to quantify contributions of emissions within various sub-bands of the PAR to target various chlorophyll absorption peaks. FIG. 3 is plot 16 indicating a PPF/W across various individual wavelength bands 18-1 to 18-3 of the PAR according to principles of the present disclosure. As previously described, PAR is defined as a larger wavelength band from 400 nm to 700 nm and therefore encompasses the entire x-axis of FIG. 3. A first wavelength band 18-1 is indicated from 400 nm to 499 nm and centered on generally blue emissions, a second wavelength band 18-2 is indicated from 500 nm to 599 and centered on generally green emissions, and third wavelength band 18-3 is indicated from 600 nm to 700 nm and centered on generally red emissions. In this regard, a PPF value may be associated with each of the three wavelength bands 18-1 to 18-3 that may be correlated to an overall PPF across the PAR range. For example, a percentage red PPF (% Red PPF) may correspond with a PPF value within the third band 18-3 compared with a total PPF across all three wavelength bands 18-1 to 18-3 of the PAR. Other useful metrics for quantifying spectral emissions for horticulture applications may include simple ratios of PPF values within individual wavelength bands 18-1 to 18-3. For example, a green/blue ratio (GBR) of the total PPF may correspond with a ratio of a PPF value of the second wavelength band 18-2 to a PPF value of the first wavelength band 18-1.

The y-axis indicates PPF/W across the various sub-wavelength bands. According to principles of the present disclosure, aggregate emissions exhibit increased PPF/W from 400 nm with each successive band and do not exhibit decreased PPF/W associated with wavelength-converted emissions above about 600 nm. In FIG. 3, an ideal PAR line is indicated. According to aspects of the present disclosure, efficiency values in a range from 3.1 to 3.5 PPF/W may be achieved while also providing aggregate emissions where the % Red PPF, defined as the percentage of the PPF value of the third wavelength band 18-3 relative to the total PPF across the PAR, is in a range from 30% to 60% and wherein the GBR, defined as the ratio of the PPF of the second wavelength band 18-2 to the PPF of the first wavelength band 18-1, is in a range from 1 to 4, or in a range from 1.9 to 3.5. For comparison, horticulture lighting that includes broadband emissions as illustrated in FIG. 1 have demonstrated maximum efficiencies near 3.1 PPF/W.

Figure 4:
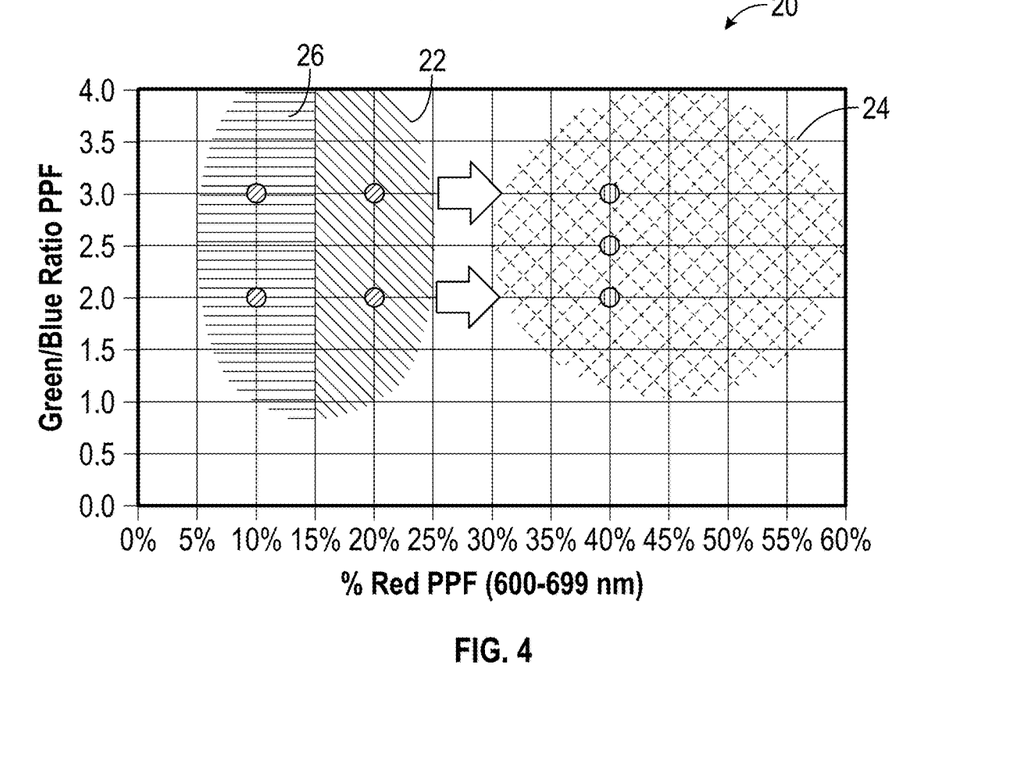
FIG. 4 is a plot that represents aggregate emissions of exemplary light-emitting devices with PAR that achieve green/blue ratio (GBR) values and percentage red photosynthetic photon flux (% Red PPF) of a total PPF with improved efficiency.

FIG. 4 is a plot 20 that represents aggregate emissions of exemplary light-emitting devices that achieve the GBR values and % Red PPF values described above with improved efficiency. A first region 22 in FIG. 4 corresponds with emissions provided by an LED chip and recipient lumiphoric material of a light-emitting device that is similar to the Light-Emitting Device 1 of FIG. 2. In this regard, the LED chip may embody a blue LED that emits a peak wavelength in a range from 400 nm to 480 nm, and the recipient lumiphoric material may be configured to covert a portion of the emissions to peak wavelengths between about 500 nm and 600 nm. In certain embodiments, such an arrangement may be referred to as a blue-pumped-green LED or a blue-shifted-green LED. As illustrated, emissions within the first region 22 may encompass GBR values from 1 to 4 and % Red PPF values from 15% to 25%. The red contributions may be attributed to an emission shoulder from the lumiphoric material that extends past 600 nm. When emissions from the first region 22 are combined with emissions from a red LED with a peak wavelength in a range from 600 nm to 700 nm, the aggregate emissions will shift from the first region 22 to a second region 24 as indicated by the arrows. In this regard, the second region 24 corresponds with aggregate emissions that may be achievable from a first light-emitting device that is similar to the Light-Emitting Device 1 of FIG. 2.

A third region 26 in FIG. 4 corresponds with emissions provided by an LED chip and recipient lumiphoric material of a light-emitting device that is similar to the Light-Emitting Device 2 of FIG. 2. In this regard, the LED chip may embody a blue LED that emits a peak wavelength in a range from 400 nm to 480 nm, and the recipient lumiphoric material may be configured to covert a portion of the emissions to peak wavelengths between about 480 nm and 560 nm. In certain embodiments, such an arrangement may be referred to as a blue-pumped-cyan LED or a blue-shifted-cyan LED. As illustrated, emissions within the third region 26 may encompass GBR values from 1.9 to 3.5 and % Red PPF values from 15% to 25%. The third region 26 exhibits less red contributions than the first region 22 due to wavelength-converted emissions that are centered in the cyan range. The red contributions may be attributed to an emission shoulder from the lumiphoric material that extends past 600 nm. When emissions from the third region 26 are combined with emissions from a red LED with a peak wavelength in a range from 600 nm to 700 nm, the aggregate emissions will shift from the third region 26 to the second region 24 as indicated by the arrows. In this regard, the second region 24 may also correspond with aggregate emissions that may be achievable from a light-emitting device that is similar to the Light-Emitting Device 2 of FIG. 2. As illustrated in FIG. 4, the first region 22 and the third region 26 may form a continuous region that may be targeted based on combinations of peak wavelengths emitted by LED chips and recipient lumiphoric materials.

In FIG. 2, points are noted within each of the regions 22, 24, and 26 that indicate specific targets that may be achieved. For example, the points illustrated within the second region 24 correspond with specific targets of GBR values for a % Red PPF target of 40%. In practice, loading percentages of the recipient lumiphoric materials and specific wavelengths of the blue LED may be tailored to achieve any point in the first and third regions 22, 26 and in combination with specific wavelengths of the red LED, aggregate emissions may be tailored to achieve any point within the second region 24.

Arrangements of light-emitting devices as described above may be provided with various form factors. In one exemplary light-emitting device, the red LED chip may reside within an LED package and the blue LED chip and lumiphoric material may reside together in a separate LED package. In such an arrangement, both LED packages may be assembled together on a common substrate, such as a printed circuit board and/or within a lighting fixture. In another exemplary light-emitting device, the red LED chip and the blue LED chip with lumiphoric material may reside together within a same LED package, thereby providing an integrated light source with aggregate emissions.

Figure 5:
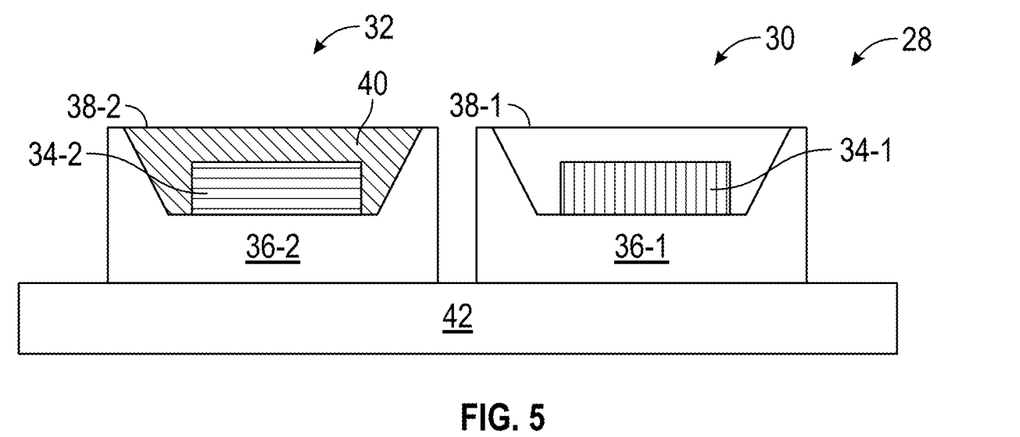
FIG. 5 is a generalized cross-sectional view of a light-emitting device that includes separate LED packages according to principles of the present disclosure.

FIG. 5 is a generalized cross-sectional view of a light-emitting device 28 that includes separate LED packages 30, 32 according to principles of the present disclosure. The light-emitting device 28 may embody any of the previously described light-emitting devices capable of providing aggregate emissions as illustrates in FIGS. 2-4. The LED package 30 includes a first LED chip 34-1 on a first support element 36-1. A first encapsulant 38-1 may cover the first LED chip 34-1 and portions of the first support element 36-1 to complete the LED package 30. In certain embodiments, the first encapsulant 38-1 may form a flat top surface while in other embodiments, the first encapsulant 38-1 may form a shape of a lens, such as having a curved surface. The first LED chip 34-1 may be configured as a red LED chip that provides a peak wavelength in a range from 600 nm to 700 nm. The LED package 32 includes a second LED chip 34-2 on a second support element 36-2 and a corresponding second encapsulant 38-2. A lumiphoric material 40 is arranged within the second encapsulant 38-2 and in a light-receiving path from the second LED chip 34-2. For example, the lumiphoric material 40 may be mixed within the second encapsulant 38-2 and dispensed on at least one surface of the second LED chip 34-2. The second LED chip 34-2 may be configured as a blue LED chip that provides peak wavelengths in a range from 400 nm to 480 nm, and the lumiphoric material 40 may be configured to provide emissions in a range from 490 nm to 600 nm. The first and second support elements 36-1, 36-2 may comprise similar or different ones of a submount or a leadframe structure as described above. As illustrated, both LED packages 30, 32 may be arranged together on a common submount 42.

Figure 6:
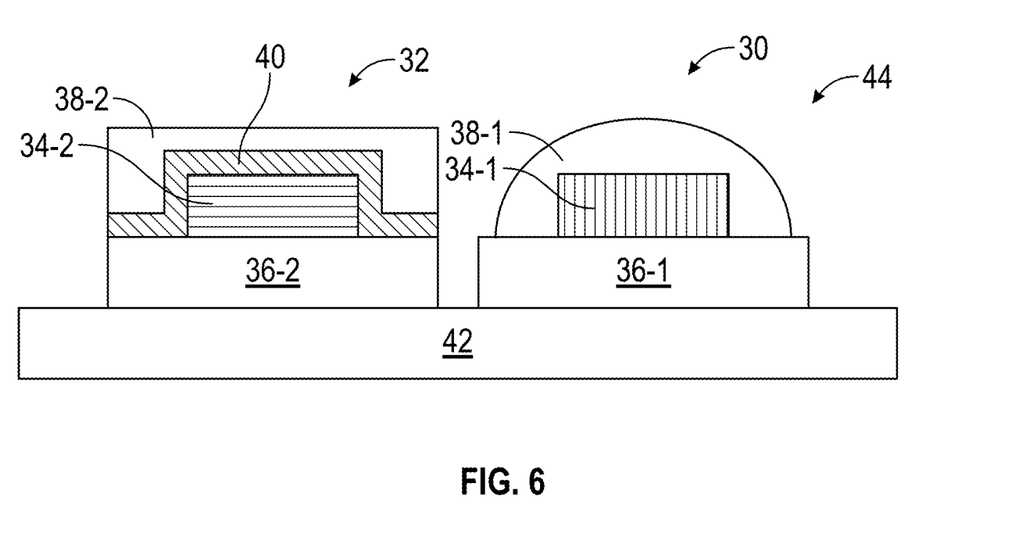
FIG. 6 is a generalized cross-sectional view of a light-emitting device that is similar to the light-emitting device of FIG. 5 for embodiments where the lumiphoric material is provided as a coating.

FIG. 6 is a generalized cross-sectional view of a light-emitting device 44 that is similar to the light-emitting device 28 of FIG. 5 for embodiments where the lumiphoric material 40 is provided as a coating on the second LED chip 34-2. The lumiphoric material 40 may also extend along one or more surfaces of the support element 36-2. The lumiphoric material 40 may also be provided only on a top surface of the second LED chip 34-2 in certain embodiments. In certain embodiments, emissions from the LED package 32 may include a mixture of emissions from the second LED chip 34-2 and the lumiphoric material 40. In other embodiments, emissions from the LED package 32 may predominantly be provided by the lumiphoric material 40 such that the LED package 32 may be referred to as having saturated emissions. In certain embodiments, the encapsulant 38-2 may have a flat top surface, while in other embodiments, the encapsulant 38-2 may include a curved shape. In FIG. 6, the LED package 30 is illustrated with a planar shape for the first support element 36-1 and a curved lens for the first encapsulant 38-1. In other embodiments, the LED package 30 may be arranged in a similar manner as illustrated in FIG. 5.

Figure 7:
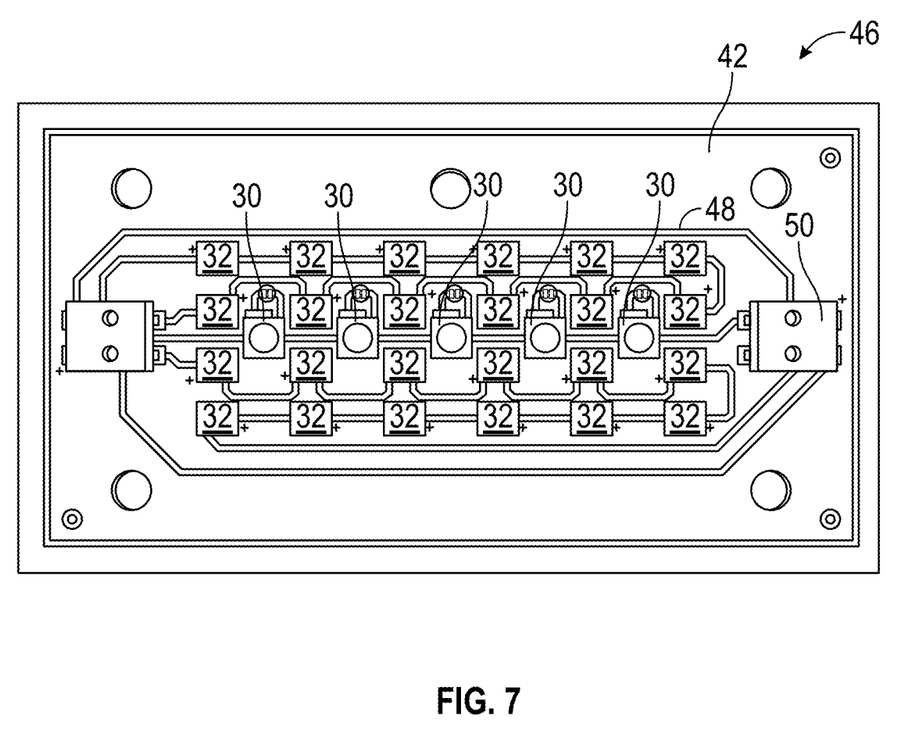
FIG. 7 is a top view of an exemplary lighting device that is populated with a plurality of the LED packages of either FIG. 5 or FIG. 6.

FIG. 7 is a top view of an exemplary lighting device 46 that is populated with a plurality of the LED packages 30, 32 of either FIG. 5 or FIG. 6. As illustrated, the LED packages 30, 32 form an array on a surface of the common submount 42. In FIG. 7, the common submount 42 may embody a printed circuit board with electrical traces 48 that connect the LED packages 30, 32. Electrical connectors 50 may also be arranged on the common submount 42 for receiving external electrical connections. As illustrated, the LED packages 30 may be arranged centrally and peripherally surrounded by the LED packages 32 to promote improved color mixing of aggregate emissions.

Figure 8:
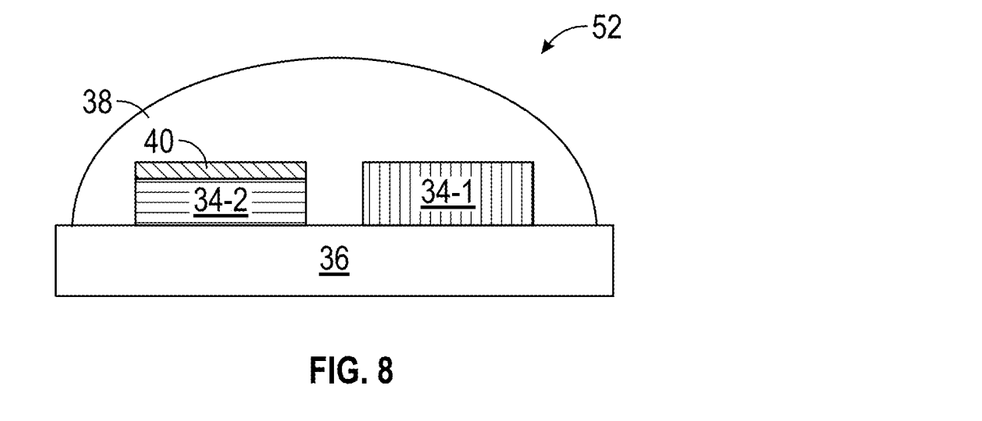
FIG. 8 is a cross-sectional view of a light-emitting device that forms a multiple chip LED package according to principles of the present disclosure.
Figure 9:
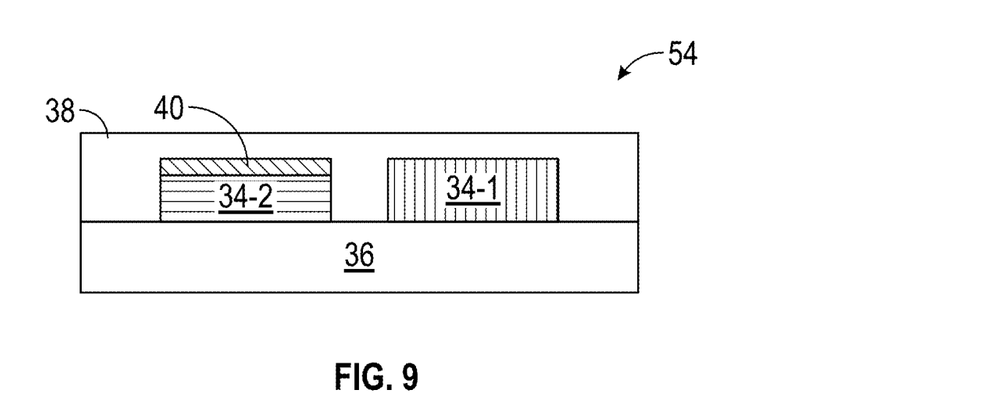
FIG. 9 is a cross-sectional view of a light-emitting device that is similar to the light-emitting device of FIG. 8 for embodiments where an encapsulant forms a flat upper surface.
Figure 10:
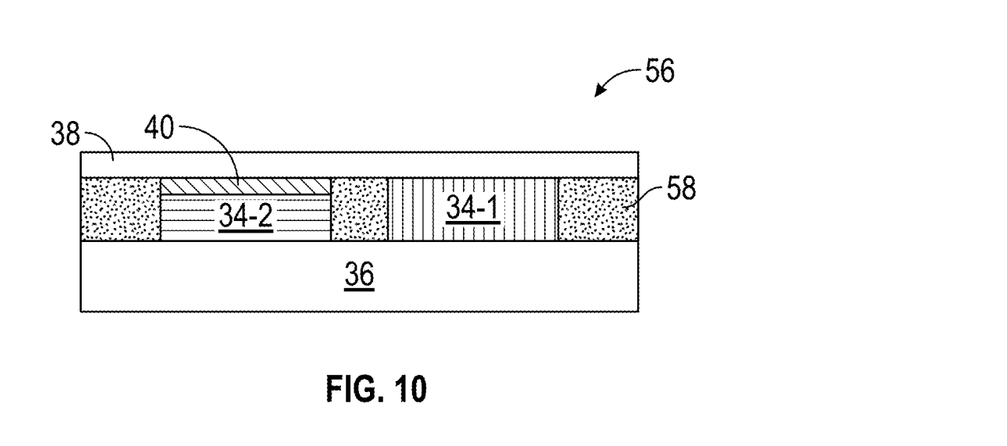
FIG. 10 is a cross-sectional view of a light-emitting device that is similar to the light-emitting devices of FIGS. 8 and 9 for embodiments that further include a light-altering material.

Light-emitting devices as described above may also embody multiple chip LED packages where aggregate emissions described above are generated by a same LED package. FIGS. 8-10 illustrate various embodiments of LED packages that include both the first LED chip 34-1, the second LED chip 34-2, and the lumiphoric material 40 as described above for FIGS. 5-7.

FIG. 8 is a cross-sectional view of a light-emitting device 52 that forms a multiple chip LED package according to principles of the present disclosure. As illustrated, the first LED chip 34-1, the second LED chip 34-2, and the lumiphoric material 40 are all arranged and on a common support element 36 and covered with a common encapsulant 38. As illustrated in FIG. 8, the encapsulant 38 may form a common lens shape, such a curved surface, for shaping aggregate emissions from the light-emitting device 52. By providing the light-emitting device 52 as a multiple chip LED package, aggregate emissions as described above may be generated and locally mixed by a single light-emitting device 52. In certain embodiments, multiple light-emitting device 52 may be arranged together to form an array on a common submount in a similar manner as illustrated for FIG. 7.

FIG. 9 is a cross-sectional view of a light-emitting device 54 that is similar to the light-emitting device 52 of FIG. 8 for embodiments where the encapsulant 38 forms a flat upper surface. In this manner, the encapsulant 38 may be referred to as a flat lens. As with the light-emitting device 52 of FIG. 8, multiple light-emitting devices 54 may be arranged together to form an array on a common submount in a similar manner as illustrated for FIG. 7.

FIG. 10 is a cross-sectional view of a light-emitting device 56 that is similar to the light-emitting devices 52 and 54 of FIGS. 8 and 9 for embodiments that further include a light-altering material 58. As described above, the light-altering material 58 may include many different materials including light-reflective materials that reflect or redirect light, light-absorbing materials that absorb light, and combinations thereof. Depending on the embodiment, the light-altering material 58 may comprise a generally white color that enhances light extraction by redirecting emissions from any of the first LED chip 34-1, the second LED chip 34-2, and the lumiphoric material 40 in a desired direction through the encapsulant 38. As with the light-emitting devices 52, 54 of FIGS. 8 and 9, multiple light-emitting devices 56 may be arranged together to form an array on a common submount in a similar manner as illustrated for FIG. 7.

It is contemplated that any of the foregoing aspects, and/or various separate aspects and features as described herein, may be combined for additional advantage. Any of the various embodiments as disclosed herein may be combined with one or more other disclosed embodiments unless indicated to the contrary herein.

Those skilled in the art will recognize improvements and modifications to the preferred embodiments of the present disclosure. All such improvements and modifications are considered within the scope of the concepts disclosed herein and the claims that follow.

What is claimed is:

1. A light-emitting device comprising:
    a first light-emitting diode (LED) chip configured to emit a first peak wavelength in a range from 600 nanometers (nm) to 700 nm;
    a second LED chip configured to emit a second peak wavelength in a range from 400 nm to less than 480 nm; and
    a lumiphoric material arranged to convert at least a portion of emissions from the second LED chip to a third peak wavelength in a range from 480 nm to less than 600 nm, wherein the lumiphoric material comprises less than 10% by weight of lumiphoric particles with emissions greater than 600 nm;
    wherein aggregate emissions for the first LED chip, the second LED chip, and the lumiphoric material comprise:
        a total photosynthetic photon flux (PPF) of wavelengths in a range from 400 nm to 700 nm, the total PPF comprising a first PPF in a first wavelength band from 400 nm to 499 nm, a second PPF in a second wavelength band from 500 nm to 599 nm, and a third PPF in a third wavelength band from 600 nm to 700 nm;
        wherein the third PPF is in a range from 30% to 60% of the total PPF; and
        wherein a ratio of the second PPF to the first PPF is in a range from 1 to 4.

2. The light-emitting device of claim 1, wherein the first peak wavelength is in a range from 650 nm to 670 nm and the second peak wavelength is in a range from 440 nm to 475 nm.

3. The light-emitting device of claim 1, wherein the third peak wavelength is in a range from 500 nm to 600 nm.

4. The light-emitting device of claim 1, wherein the third peak wavelength is in a range from 480 nm to 510 nm.

5. The light-emitting device of claim 1, wherein the aggregate emissions comprise an efficiency of at least 3.1 PPF per watt (PPF/W) in a wavelength range of 400 nm to 700 nm.

6. The light-emitting device of claim 5, wherein the efficiency is in a range from 3.1 to 3.5 PPF/W.

7. The light-emitting device of claim 1, wherein the ratio of the second PPF to the third PPF is in a range from 1.9 to 3.5.

8. The light-emitting device of claim 1, wherein the aggregate emissions have less than 10% emissions generated by any lumiphoric materials with peak wavelength emissions above 600 nm.

9. The light-emitting device of claim 1, wherein:
    the first LED chip resides within a first LED package, the first LED package comprising a first support element and a first encapsulant;
    the second LED chip and lumiphoric material reside within a second LED package, the second LED package comprising a second support element and a second encapsulant; and
    the first LED package and the second LED package are mounted on a common substrate.

10. The light-emitting device of claim 1, wherein the first LED chip, the second LED chip, and the lumiphoric material reside within a same LED package, the LED package comprising a support element on which the first LED chip and the second LED chip are mounted and an encapsulant that covers at least a portion of the first LED chip and the second LED chip.

11. A light-emitting device comprising:
- a first light-emitting diode (LED) chip configured to emit a first peak wavelength in a range from 600 nanometers (nm) to 700 nm;
- a second LED chip configured to emit a second peak wavelength in a range from 400 nm to less than 480 nm; and
- a lumiphoric material arranged to convert at least a portion of emissions from the second LED chip to a third peak wavelength in a range from 480 nm to less than 600 nm, wherein the lumiphoric material comprises less than 10% by weight of lumiphoric particles with emissions greater than 600 nm;
- wherein aggregate emissions for the first LED chip, the second LED chip, and the lumiphoric material comprise an efficiency of at least 3.1 photosynthetic photon flux (PPF) per watt (PPF/W) in a range from 400 nm to 700 nm.

12. The light-emitting device of claim 11, wherein a total PPF comprises wavelengths in a range from 400 nm to 700 nm, the total PPF comprising:
- a first PPF in a first wavelength band from 400 nm to 499 nm;
- a second PPF in a second wavelength band from 500 nm to 599 nm; and
- a third PPF in a third wavelength band from 600 nm to 700 nm;
- wherein the third PPF is in a range from 30% to 60% of the total PPF.

13. The light-emitting device of claim 12, wherein a ratio of the second PPF to the third PPF is in a range from 1 to 4.

14. The light-emitting device of claim 12, wherein the third peak wavelength is in a range from 500 nm to 600 nm.

15. The light-emitting device of claim 12, wherein the third peak wavelength is in a range from 480 nm to 510 nm.

16. The light-emitting device of claim 11, wherein the efficiency is in a range from 3.1 to 3.5 PPF/W.

17. The light-emitting device of claim 11, wherein the aggregate emissions have less than 10% emissions generated by any lumiphoric materials with peak wavelength emissions above 600 nm.

18. The light-emitting device of claim 11, wherein the aggregate emissions have less than 5% emissions generated by any lumiphoric materials with peak wavelength emissions above 600 nm.

19. The light-emitting device of claim 11, wherein:
- the first LED chip resides within a first LED package, the first LED package comprising a first support element and a first encapsulant;
- the second LED chip and lumiphoric material reside within a second LED package, the second LED package comprising a second support element and a second encapsulant; and
- the first LED package and the second LED package are mounted on a common substrate.

20. The light-emitting device of claim 11, wherein the first LED chip, the second LED chip, and the lumiphoric material reside within a same LED package, the LED package comprising a support element on which the first LED chip and the second LED chip are mounted and an encapsulant that covers at least a portion of the first LED chip and the second LED chip.

* * * * *